United States Patent [19]

Houkawa et al.

[11] 4,007,433
[45] Feb. 8, 1977

[54] ELASTIC SURFACE WAVE FILTER

[75] Inventors: Kouji Houkawa, Kodaira; Fujio Ishihara, Mito, both of Japan

[73] Assignee: Nippon Telegraph and Telephone Public Corporation, Tokyo, Japan

[22] Filed: July 9, 1975

[21] Appl. No.: 594,523

[30] Foreign Application Priority Data

July 15, 1974 Japan .............................. 49-80893

[52] U.S. Cl. .................................. 333/72; 310/8.3; 310/9.8
[51] Int. Cl.² ...................... H03H 9.04; H03H 9.26; H03H 9.32; H01L 41/10
[58] Field of Search ............... 333/30 R, 72; 310/8, 310/8.1, 8.2, 9.8

[56] References Cited
UNITED STATES PATENTS

| | | | |
|---|---|---|---|
| 3,633,132 | 1/1972 | Hartemann | 333/30 R |
| 3,663,899 | 5/1972 | Dieulesaint et al. | 333/72 X |
| 3,699,364 | 10/1972 | Gerard | 310/9.8 |
| 3,818,382 | 6/1974 | Holland et al. | 333/30 R X |
| 3,835,422 | 9/1974 | Hartemann | 333/72 |

*Primary Examiner*—Alfred E. Smith
*Assistant Examiner*—Marvin Nussbaum
*Attorney, Agent, or Firm*—Marshall & Yeasting

[57] ABSTRACT

An elastic surface wave filter is disclosed which is composed of a substrate for the propagation thereon of elastic surface waves and transmitting and receiving transducers, each having at least an electrode deposited on the major surface of the substrate and in which the transmitting and receiving transducers are disposed line connectin the major surface of the substrate a predetermined distance apart from each other; the electrode of one or both of the transmitting and receiving transducers is formed with first and second comb-shaped electrodes; and the first and second electrodes are disposed with each electrode element of the latter extending between adjacent ones of the electrode elements of the former. The electrode elements of the first and/or second comb-shaped electrodes are weighted in terms of length and the extent of the region of overlapping of the first and second comb-shaped electrodes in a first direction, i.e. parallel to a line connecting the transmitting and receiving transducers, is the same at any point in a second direction perpendicular to the first direction.

3 Claims, 17 Drawing Figures

ELASTIC SURFACE WAVE FILTER

BACKGROUND OF THE INVENTION

1. Field of the Invention

This invention relates to improvements in an elastic surface wave filter which is composed of a substrate for the propagation thereon of elastic surface waves and transmitting and receiving transducers, each having at least an electrode deposited on the major surface of the substrate and in which the transmitting and receiving transducers are disposed on the major surface of the substrate a predetermined distance a part from each other, the electrode of one or both of the transmitting and receiving transducers is formed with first and second comb-shaped electrodes and the first and second comb-shaped electrodes are disposed with each electrode element of the latter lying between adjacent ones of the electrode elements of the former.

2. Description of the Prior Art

There are heretofore been proposed an elastic surface wave filter of this kind in which electrode elements of first and second comb-shaped electrodes of a transducer are not weighted in terms of length. Such an elastic surface wave filter is called an elastic surface wave filter provided with a transducer having non-weighted electrode. In the case of the non-weighted electrode, the region of overlapping i.e. interdigating region of electrode elements of first and second comb-shaped electrodes (which region will hereinafter be referred to as the overlapping region) is rectangular with sides respectively parallel and perpendicular to a line connecting the transmitting and receiving transducers (the direction of which line will hereinafter be referred to as the first direction). In the conventional elastic surface wave filter provided with the transducer having such a non-weighted electrode, the relative minimum attenuation (an insertion loss) in the pass band is relatively small but that in the rejection band is also relatively small.

Further, there has also been proposed an elastic surface wave filter of this kind in which the electrode elements of the first and second comb-shaped electrodes of the transducer are weighted in terms of length. Such an elastic surface wave filter is called an elastic surface wave filter provided with a transducer having a weighted electrode. With such a conventional weighted electrode, the shape of the region of overlapping of the electrode elements of the first and second comb-shaped electrodes is such that its extent along a line parallel to the first direction varies with displacement of the line in a second direction, i.e. a direction normal to the first direction, so as to pass through different points along the length of an electrode element. In the conventional elastic surface wave filter provided with the transducer having such weighted electrode, the relative minimum attenuation in the rejection band is relatively large and that in the pass band is also relative large.

Accordingly, in such conventional elastic surface wave filters, whether the electrode is weighted or not, it is difficult to make insertion loss in the pass band relatively small and attenuation in the rejection band relatively large, so that these conventional elastic surface wave filters cannot be said to have excellent band-pass characteristic.

SUMMARY OF THE INVENTION

Accordingly, this invention is to provide a novel elastic surface wave filter of excellent band-pass characteristic in which the relative minimum attenuation in the pass band is relatively small as is the case with the conventional elastic surface wave filter provided with the transducer having the non-weighted electrode but the relative minimum attenuation in the rejection band is relatively large as is the case with the conventional elastic surface wave filter provided with the transducer having the weighted electrode, so that the difference between the relative minimum attenuation in the pass band and that in the rejection band is sufficiently large.

In the elastic surface wave filter according to this invention, electrode elements of first and/or second comb-shaped electrodes of transducers are weighted in terms of length. Accordingly, the elastic surface wave filter of this invention can be called an elastic surface wave filter provided with a transducer having weighted electrode. In this invention, however, the overlapping region of the electrode elements of the first and second comb-shaped electrodes has a configuration such that its extent (length) along a line parallel to the first direction is substantially constant as the line is displaced in a second direction normal to the first direction.

In the elastic surface wave filter provided with the transducer having the weighted electrode, the relative minimum attenuation in the rejection band is larger than that of the elastic surface wave filter provided with the transducer having the non-weighted electrode by virtue of the employment of the transducer having the weighted electrode.

Further, even in the elastic surface wave filter provided with the transducer having the weighted electrode, if the overlapping region of the electrode elements of the first and second comb-shaped electrodes in the first direction is of such a plane configuration that its length in the first direction is substantially the same at any point in the second direction, the relative minimum attenuation in the pass band is smaller than that in the case where the overlapping region has such a plane configuration that its length in the first direction is not substantially the same at any point in the second direction.

Accordingly, in the elastic surface wave filter of this invention, the relative minimum attenuation in the pass band is relatively small as is the case with the conventional elastic surface filter provided with the transducer having the non-weighted electrode and the relative minimum attenuation in the rejection band is relatively large as is the case with the conventional elastic surface wave filter provided with the transducer having the weighted electrode. Consequently, the difference between the relative minimum attenuation in the pass band and that in the rejection band is sufficiently large to provide for enhanced band-pass characteristic.

DESCRIPTION OF THE PREFERRED EMBODIMENTS

With reference to the drawings, this invention will hereinafter be described in detail.

Figure 1:
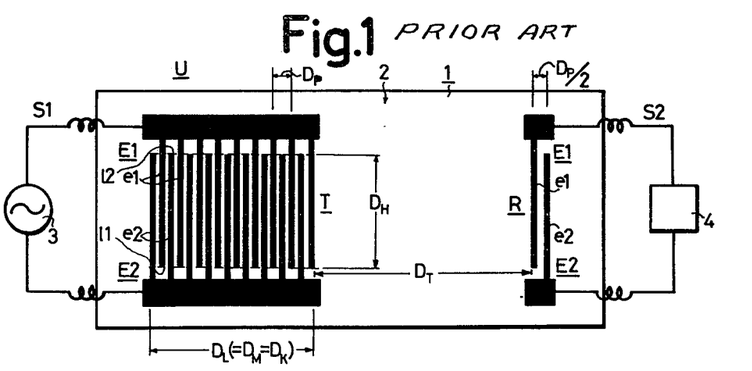
FIG. 1 is a schematic diagram showing a conventional elastic surface wave filter provided with a transducer having non-weighted electrode.

FIG. 1 shows a conventional elastic surface wave filter provided with a transducer having non-weighted electrode, which is indicated generally by U. In the elastic surface wave filter U, transmitting and receiving transducers T and R are disposed in side-by-side but predetermined spaced relation to each other on the major surface 2 of a substrate 1 for the propagation thereon of elastic surface waves. In this case, the substrate 1 is piezoelectric in itself or has the construction that a piezoelectric layer is deposited over a non-piezoelectric substrate. The transducers T and R are each composed of a pair of electrodes E1 and E2 formed on the major surface 2 of the substrate 1. The electrodes E1 and E2 are comb-shaped electrodes, which are disposed with each of electrode elements $e2$ of the one comb-shaped electrode E2 lying between adjacent ones of electrode elements $e1$ of the other comb-shaped electrode E1. In the present example, however, the electrode elements $e1$ and $e2$ of the electrodes E1 and E2 of the receiving transducers R are both shown to be single.

The electrode elements $e1$ and $e2$ of the comb-shaped electrodes E1 and E2 of the transmitting transducer T are not weighted in terms of length. Namely, the electrode elements $e1$ and $e2$ of the comb-shaped electrodes E1 and E2 extend in a direction perpendicular to the first direction in which the transmitting and receiving transducers T and R are connected. The plane configuration of the overlapping region that the electrode elements $e1$ and $e2$ of the electrodes E1 and E2 overlap in the first direction, formed to include a line $l1$ connecting the free ends of the electrode elements $e1$ and a line $l2$ connecting the free ends of the electrode elements $e2$, is a regular square having two sides parallel with the first direction.

Figure 2:
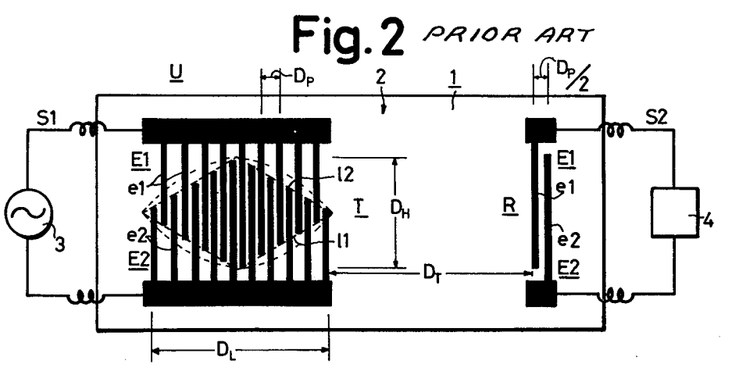
FIG. 2 is a schematic diagram illustrating one example of a conventional elastic surface wave filter provided with a transducer having weighted electrode.

FIG. 2 shows one example of a conventional elastic surface wave filter provided with a transducer having weighted electrode, which is indicated generally by U as in the case of FIG. 1. The parts corresponding to those in FIG. 1 are identified by the same reference numerals and characters and no detailed description will be repeated. The illustrated example is identical in construction with the FIG. 1 example except that the electrode elements $e1$ and $e2$ of the comb-shaped electrodes E1 and E2 of the transmitting transducer T are weighted in terms of length as will hereinbelow be described. Namely, the shape of the overlapping region that the electrode elements $e1$ and $e2$ of the electrodes E1 and E2 overlap in the first direction, formed to include the lines $l1$ and $l2$ connecting the free ends of the electrode elements $e1$ and $e2$ respectively, is a rhomb located so that a line connecting a pair of opposing vertices is substantially parallel with the first direction.

Figure 3:
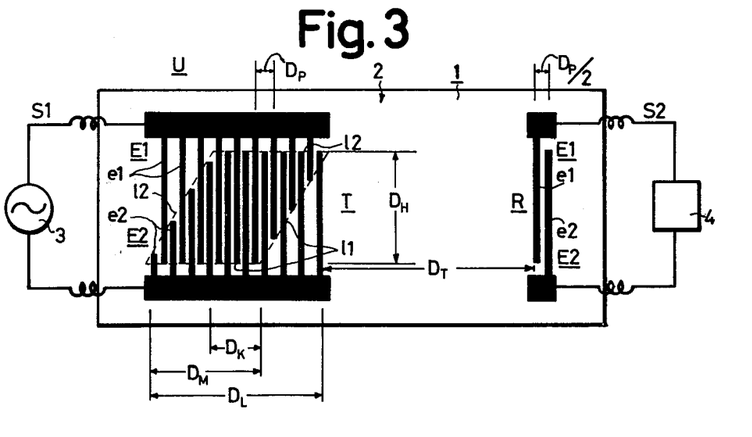
FIG. 3 is a schematic diagram showing an example of an elastic surface wave filter according to this invention.

FIG. 3 illustrates one example of an elastic surface wave filter of this invention, which is identified generally by U as in the case of FIG. 1. In FIG. 3, the parts corresponding to those in FIG. 1 are marked with the same reference numerals and characters and no detailed description will be given of them. The illustrated example is identical in construction with the FIG. 1 example except that the electrode elements $e1$ and $e2$ of the comb-shaped electrodes E1 and E2 of the transmitting transducer T are weighted in terms of length as will be described hereinbelow. Namely, the shape of the overlapping region that the electrode elements $e1$ and $e2$ of the electrodes E1 and E2 overlap in the first direction, formed to include the lines $l1$ and $l2$ connecting the free ends of the electrode elements $e1$ and $e2$ respectively, is a parallelogram in which two sides are parallel with the first direction.

Figures 4, 5A, 5B, 5D:
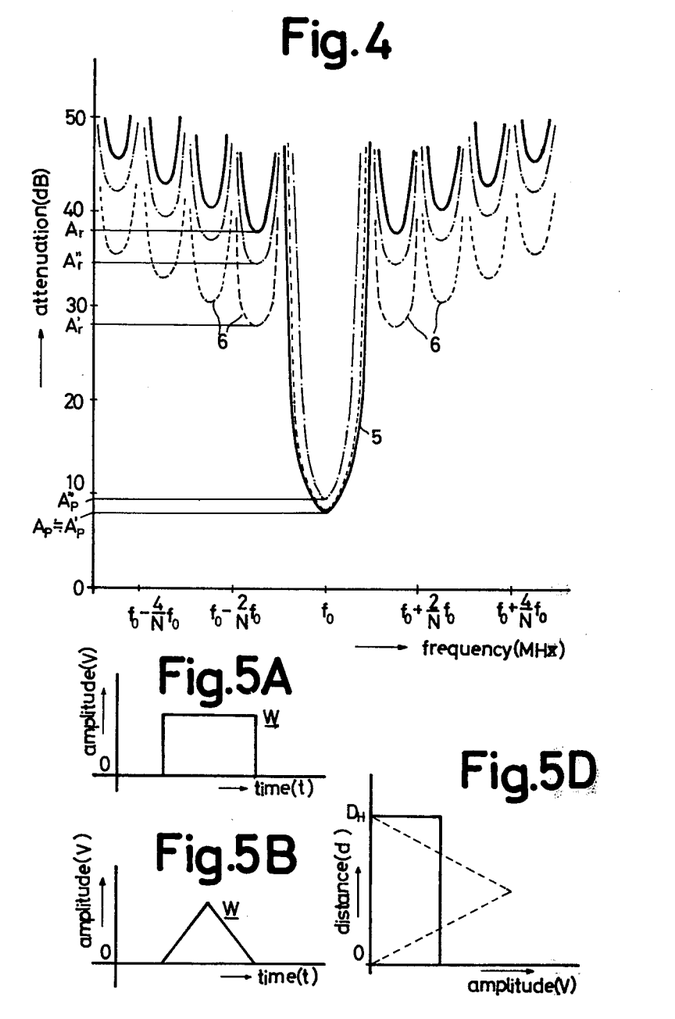
FIG. 4 is a graph showing the band-pass characteristics of the elastic surface wave filter of this invention depicted in FIG. 3 and the conventional elastic surface wave filters shown in FIGS. 1 and 2.
FIGS. 5A, 5B and 5C are diagrams showing the wave forms of elastic surface waves in the elastic surface wave filters shown in FIGS. 1, 2 and 3, respectively.
FIG. 5D is a schematic diagram showing the distribution of the amplitude of elastic surface waves, for explaining the elastic surface wave filter of this invention and the conventional elastic surface wave filters depicted in FIGS. 3 and 1 and 2, respectively.

In the conventional elastic surface wave filter shown in FIG. 1 which is provided with the transducer having the non-weighted electrode, in the conventional elastic surface wave filter shown in FIG. 2 which is provided with the transducer having the weighted electrode and in the elastic surface wave filter of this invention exemplified in FIG. 3, when an electric signal S1 is applied between the electrodes E1 and E2 of the transmitting transducer T from an electric signal source 3, it is converted by the transducer T into an elastic surface wave, which is propagated on the substrate 1 and received by the receiving transducer R to be converted thereby into an electric signal S2. Accordingly, if a load 4 is connected between the electrodes E1 and E2 of the transducer R, those components of the electric signal S1 which are delayed behind the electric signal S1 in accordance with the distance between the transducers T and R and lie in the pass band based on the overall band-pass characteristic of the electric signal S1 between the electrodes E1 and E2 of the transducer T and between the electrodes E1 and E2 of the transducer R, are applied as the electric signal S2 to the load 4. Thus, the function of a band-pass filter is obtained. In this case, since the electrodes E1 and E2 of the transducer T are each formed with a comb-shaped electrode having many electrode elements and since the electrodes E1 and E2 of the other transducer R are each formed with a comb-shaped electrode having one electrode element, the abovesaid overall band-pass characteristic depends mainly on the band-pass characteristic of the transducer T. Consequently, the overall band-pass characteristic is substantially the same as the band-pass characteristic of the transducer T. The transducer T exhibits such a band-pass characteristic as indicated by a lobe 5 (hereinafter referred to as the main lobe) in FIG. 4 which has a center frequency ($f_0$) dependent mainly upon the distance between adjacent ones of the electrode elements $e1$ and $e2$ of the electrodes E1 and E2 of the transducer T and, at the same time, unwanted side lobes 6 are produced outside of the main lobe 5, that is, the pass band, in other words, in the rejection band. In FIG. 4, full lines indicate the characteristic of the elastic surface wave filter of this invention shown in FIG. 3 and broken lines and chain lines generally indicate the characteristics of the conventional elastic surface wave filters depicted in FIGS. 1 and 2, respectively. With the band-pass characteristics shown in FIG. 4, attenuation exhibits infinity at frequencies $$f_0 \pm \frac{2}{N} f_0, \; f_0 \pm \frac{4}{N} f_0,$$

theoretically.

Figure 5C:
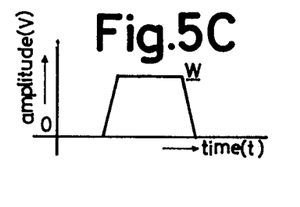

Let it be assumed that the constructions of FIGS. 1, 2 and 3 are identical with one another in the quality of the substrate 1, the quality and dimensions of the electrode elements $e1$ and $e2$ of the electrodes E1 and E2 of the transducers T and R, the distance $D_t$ between the transducers T and R, the distance $D_p$ between adjacent ones of the electrode elements $e1$ and $e2$ of the electrodes E1 and E2 of the transducers T and R and the maximum width $D_H$ of the electrode elements overlapping region in the second direction. In such a case, the relative minimum attenuation in the pass band of the elastic surface wave filter of this invention shown in FIG. 3 is obtained at a value $A_p$ substantially equal to that $A_p'$ of the relative minimum attenuation in the conventional elastic surface wave filter provided with the transducer having the non-weighted electrodes depicted in FIG. 1 but smaller than that $A_p''$ in the conventional elastic surface wave filter provided with the transducer having the weighted electrodes shown in FIG. 2. Further, the relative minimum attenuation in the rejection band of the elastic surface wave filter of this invention exemplified in FIG. 3 is obtained at a value $A_r$ substantially to that $A_r''$ in the conventional elastic surface wave filter shown in FIG. 2 but larger than that $A_r'$ in the conventional elastic surface wave filter shown in FIG. 1. The reasons for this is as follows:

Generally, the principles of operation of the elastic surface wave filter are substantially equivalent to those of a transversal filter and its band-pass characteristic and impulse response characteristic bear the relation of 1:1 to each other. Where the electric signal applied to the transmitting transducer T is an impulse, an elastic surface wave (hereinafter identified as W) which is derived from the transmitting transducer T and is propagated in the substrate 1 is obtained in the form of a wave form corresponding to the configuration of the overlapping region that the electrode elements of the comb-shaped electrodes of the transmitting transducer T overlap in the case where the first direction is assumed to be a time axis and the second direction is assumed to be an amplitude axis. Accordingly, the elastic surface waves W in the cases of FIGS. 1, 2 and 3 are obtained to have such wave forms as shown in FIGS. 5A, 5B and 5C, respectively, In FIGS. 5A, 5B and 5C, reference character $t$ indicates time and V designates amplitude. Consequently, the band-pass characteristics of the elastic surface wave filters respectively provided with the transmitting transducer T having the weighted electrode, depicted in FIGS. 2 and 3, and the band-pass characteristic of the elastic surface wave filter provided with the transmitting transducer having the non-weighted electrode, shown in FIG. 1, are different from each other especially in the rejection band. And, in the case of the elastic surface wave filters respectively provided with the transmitting transducer T having the weighted electrodes, the effect that the components of the elastic surface wave derived from the transmitting transducer T, which lie in the rejection band, reach the receiving transducer R in such amplitude and phase that the components are cancelled each other, is larger than that obtainable with the elastic surface wave filter provided with the transmitting transducer T having the non-weighted electrode. Accordingly, the relative minimum attenuation in the rejection band of the elastic surface wave filters respectively provided with the transmitting transducer T having the weighted electrode, shown in FIGS. 2 and 3, respectively, is larger than the relative minimum attenuation in the rejection band of the elastic surface wave filter of FIG. 1 which is provided with the transmitting transducer T having the non-weighted electrode.

On the other hand, in the elastic surface wave filter which is provided with the transmitting transducer and in which the aforesaid overlapping region has such a plane configuration that its length in the first direction is substantially the same at any position in the second direction, that is, in the elastic surface wave filters shown in FIGS. 1 and 3, the amplitude distribution of the elastic surface wave W in the second direction is substantially uniform as indicated by the full line in FIG. 5D in which the abscissa represents the value V of the amplitude and the ordinate represents the distance $d$ relative to one end of the overlapping region in the direction of its width $D_H$. However, in the elastic surface wave filter provided with the transmitting transducer T in which the overlapping region has such a plane configuration that its length in the first direction is not substantially the same at any point in the second direction, that is, in the elastic surface wave filter shown in FIG. 2, the abovesaid amplitude distribution is not uniform as indicated by the broken line in FIG. 5D. Accordingly, in the elastic surface wave filter provided with the transmitting transducer T in which the overlapping region has such a configuration that its length in the first direction is substantially the same at any point in the second direction, that is, in the elastic surface wave filters of FIGS. 1 and 3, the conversion efficiency of the receiving transducer R for converting the elastic surface wave into a corresponding electric signal is higher than that obtainable with the elastic surface wave filter provided with the transmitting transducer T in which the overlapping region has such a configuration that its length in the first region is not the same at all points in the second direction, that is, in the case of the elastic surface wave filter shown in FIG. 2. Therefore, in the case of the elastic surface wave filter U of this invention, shown in FIG. 3, which is provided with the transducer T having the weighted electrode, if the shape of the overlapping region is such that its length in the first direction is the same at any point in the second direction, the relative minimum attenuation in the pass band is smaller than that in the case where the abovesaid length is not the same at all points in the second direction.

Consequently, in the elastic surface wave filter of this invention shown in FIG. 3, the difference between the relative minimum attenuation value $A_p$ in the pass band and that $A_r$ in the rejection band remarkely increases, as compared with those in the conventional elastic surface wave filters shown in FIGS. 1 and 2, thus providing excellent band-pass characteristic.

By the way, in our experiment conducted with the elastic surface wave filter of this invention illustrated in FIG. 3 in which the aforementioned distances $D_T$ and $D_P$ were 4mm and 100$\mu$m, respectively; the length $D_M$ of the overlapping region in the first direction was 27 pairs in terms of the number of pairs of the electrode elements $e1$ and $e2$ of the electrodes E1 and E2; the width $D_H$ was 5mm; the length $D_K$ of that part of the overlapping region in the first direction which has the width $D_H$ was 8 pairs in terms of the number of pairs of the electrode elements $e1$ and $e2$ of the electrodes E1 and E2; and the length $D_L$ of the transmitting transducer T in the first direction was 46 pairs in terms of the number of pairs of the electrode elements $e1$ and $e2$ of the electrodes E1 and E2, a band-pass characteristic having a center frequency $f_0$ of 34.2MHz was obtained. And the relative minimum attenuation value $A_p$ at the frequency $f_0$ was about 8dB, the relative minimum attenuation value $A_r$ in the rejection band was about 38dB and, as a result of this, the difference between the abovesaid attenuation values $A_p$ and $A_r$ was approximately 30dB. Further, in our experiment with the elastic surface wave filter of FIG. 1 in which the numerical values of the various parts were the same as the abovesaid ones except that $D_M=D_K=D_L=27$ pairs of electrode elements $e1$ and $e2$ of the electrodes E1 and E2 as described above with regard to FIG. 3, the relative minimum attenuation value $A_p'$ in the pass band having a center frequency $f_0$ of 34.2MHz was 8dB and the relative minimum attenuation value $A_r'$ in the rejection band was 28dB, and consequently the difference between them $A_p'$ and $A_r'$ was only 20dB. Further, in our experiment of the FIG. 2 example whose dimensions were the same as those used in the above experiment of the FIG. 3 example except that the length $D_K$ was zero and $D_L=54$ pairs of electrode elements $e1$ and $e2$, the relative minimum attenuation $A_p''$ in the pass band with the center frequency $f_0$ at 34.2MHz was 9.5dB and that $A_r''$ in the rejection band was 34.5dB, with the result that the difference between tham was only 25dB.

Figure 6:
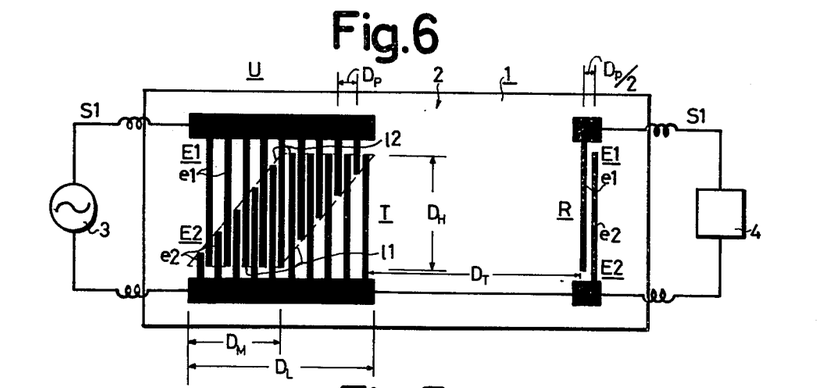
FIGS. 6 to 14 are schematic diagrams respectively illustrating other examples of the elastic surface wave filter of this invention.
Figure 7:
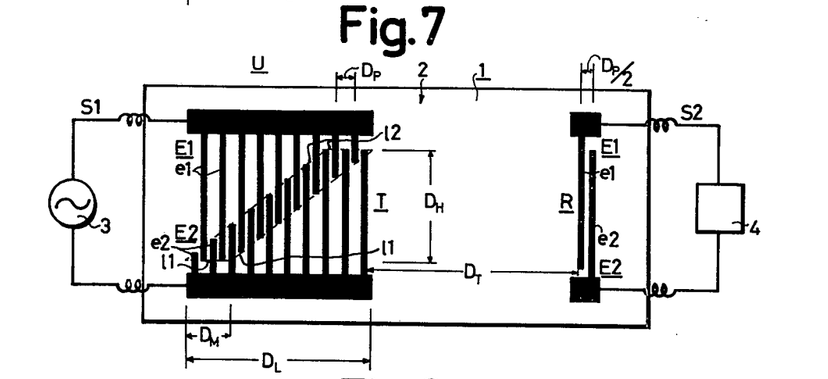

FIGS. 6 and 7 illustrate modified forms of the elastic surface wave filter of this invention shown in FIG. 3. In FIGS. 6 and 7, parts corresponding to those in FIG. 3 are identified by the same reference numerals and characters and no detailed description will be repeated. The FIG. 6 example is identical in construction with the FIG. 3 example except that the length $D_M$ is smaller than that in the latter and that the length $D_K$ is substantially zero. The FIG. 7 example is also identical in construction with the FIG. 3 example except that the length $D_M$ is far smaller than that in the latter.

It will be evident that such constructions provide excellent band-pass characteristic as in the case with the FIG. 3 example, though no detailed description will be made. However, the example of FIG. 6 is different from that of FIG. 3 in that the relative minimum attenuation in the rejection band is a little smaller than that in the case of FIG. 3 to such an extent as to be substantially equal to that in the case of FIG. 2, since the abovesaid length $D_M$ is smaller than that in the case of FIG. 3 and since the length $D_K$ is substantially zero. Further, since the abovesaid length $D_M$ is sufficiently larger than that in the case of FIG. 3, the FIG. 7 exampleis different from the FIG. 3 example in that the impedance of the transmitting transducer T between the electrodes E1 and E2 is higher than that in the case of FIG. 3.

Figure 8:
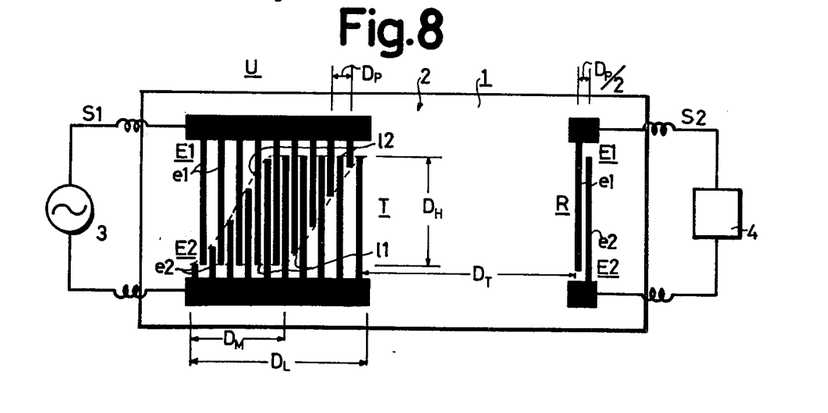

FIG. 8 shows another modification of this invention, in which parts corresponding to those in FIG. 3 are marked with the same reference numerals and characters and which is identical in construction with the FIG. 3 example except that the lines $l1$ and $l2$ connecting the free ends of the electrode elements $e1$ and $e2$ of the electrodes E1 and E2 of the transducer T both take the form of the lines including curves extending along cosine waves.

It will be apparent that such a construction also provides excellent band-pass characteristic as is the case with the FIG. 3 example, although no detailed description will be given. In this case, however, since it is arranged that the lines $l1$ and $l2$ connecting the free ends of the electrode elements $e1$ and $e2$ of the electrodes E1 and E2 of the transducer T each take the form of a curve extending along a cosine wave, the wave form of the elastic surface wave corresponding to those described previously with regard to FIGS. 5A to 5C becomes a raised cosine wave form. Accordingly, the present example is different from the example of FIG. 3 in that the relative minimum attenuation in the rejection band is larger about 10dB than that in the case of latter.

In our experiment conducted with the elastic surface wave filter of FIG. 8 in which the values of $D_T$, $D_P$, $D_M$, $D_H$ and $D_L$ were the same as those in the FIG. 3 example and $D_K$ was substantially zero, the aforesaid relative minimum attenuation value $A_p$ in the pass band having the center frequency $f_0$ of 34.2MHz was about 8dB and the relative minimum attenuation value $A_r$ in the rejection band was about 48dB, and consequently the difference between them $A_p$ and $A_r$ was approximately 40dB. Further, in the construction of FIG. 8, when the abovesaid lines $l1$ and $l2$ were represented in the form of lines including curves extending along cosine waves as indicated by broken lines in FIG. 2 and the aforesaid overlapping region was rhomb like as a whole, the minimum attenuation in the pass band was about 9dB and that in the rejection band was about 49dB, and consequently the difference between them was substantially 40dB.

Figure 9:
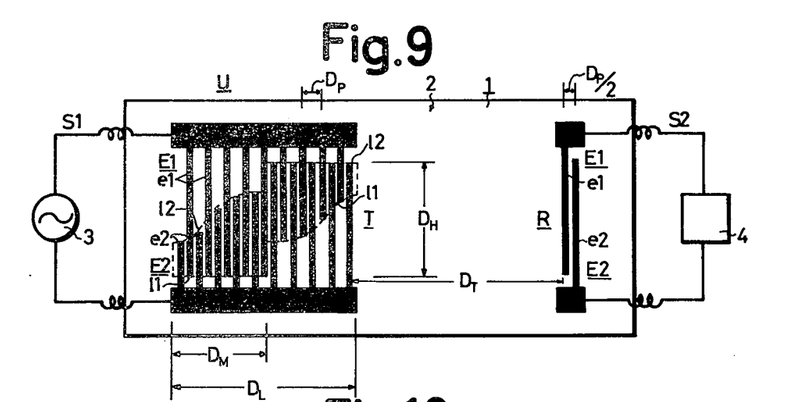
Figure 10:
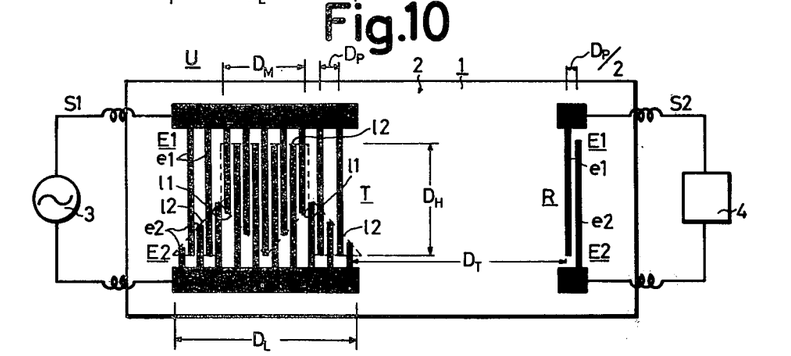

FIGS. 9 and 10 illustrate further examples of this invention, in which parts corresponding to those in FIG. 3 are identified by the same reference numerals and characters. The FIG. 9 example is identical in construction with the FIG. 3 example except that where the right half part of the overlapping region formed to include the lines $l1$ and $l2$ is turned upside down and the line of its lower side lies on the extension of the line of the lower side of the left half part and is parallel with the first direction, the line of the upper side is in the form of a line including a curve extending along a cosine wave. The FIG. 10 example is also identical in construction with the FIG. 3 example except that where the central part of the overlapping region formed to include the lines $l1$ and $l2$ is turned upside down and the line of its lower side lies on the extension of the lines of the lower side of the left and right parts and are parallel with the first direction, the line of the upper side is in the form of a curve extending along a straight line.

It will be seen that such construction provide excellent band-pass characteristic as in the FIG. 3 example, although no detailed description will be given. In the case of FIG. 9, the relative minimum attenuation in the rejection band is substantially equal to that in the case of FIG. 3 but, in the case of FIG. 10, the relative minimum attenuation in the rejection band is slightly smaller than that in the case of FIG. 3, as described previously with regard to FIG. 6.

Figure 11:
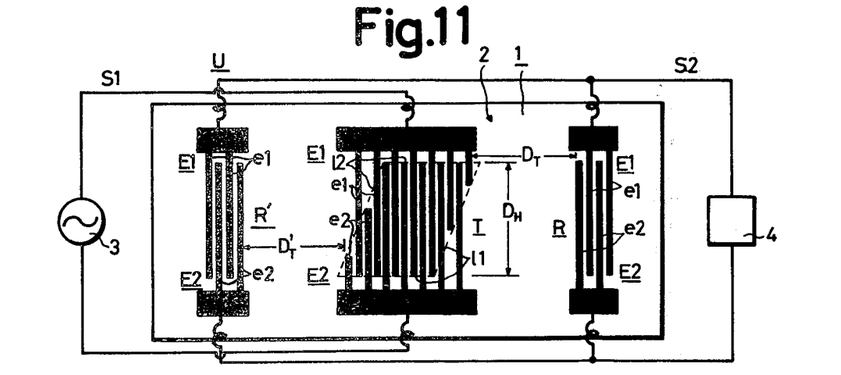

FIG. 11 shows another example of this invention, in which parts corresponding to those in FIG. 3 are identified by the same reference numerals and characters and no detailed description will be made of them. The present example is identical in construction with the FIG. 3 example except that another receiving transducer R' is disposed on the major surface 2 of the substrate 1 on the opposite side from the receiving transducer R but at the position symmetrical with respect thereto as shown and that the electrodes E1 and E2 of the receiving transducer R' are connected in parallel with those E1 and E2 of the receiving transducer R. In this example, however, the electrodes E1 and E2 of the receiving transducers R and R' are formed with comb-shaped electrodes respectively having many electrode elements as is the case with the electrodes E1 and E2 of the transmitting transducer T.

In our experiment conducted with the above construction in which the distance $D_T'$ between the transducers T and R' was equal to that $D_T$ between the transducers T and R and the other dimensions were the same as those used in the experiment of the FIG. 3 example, the relative minimum attenuation value $A_p$ in the pass band having the center frequency $f_0$ of 34.2MHz was about 5dB and the relative minimum attenuation value $A_r$ in the rejection band was about 35dB, and consequently the difference between them $A_p$ and $A_r$ was approximately 30dB. By the way, in our experiment in which the transducer T in the construction of FIG. 11 has the non-weighted electrode and the same dimensions as in the conventional filter shown in FIG. 1, the relative minimum attenuation in the pass band was about 5dB and that in the rejection band was about 25dB, and consequently the difference between them was only about 20dB.

Figure 12:
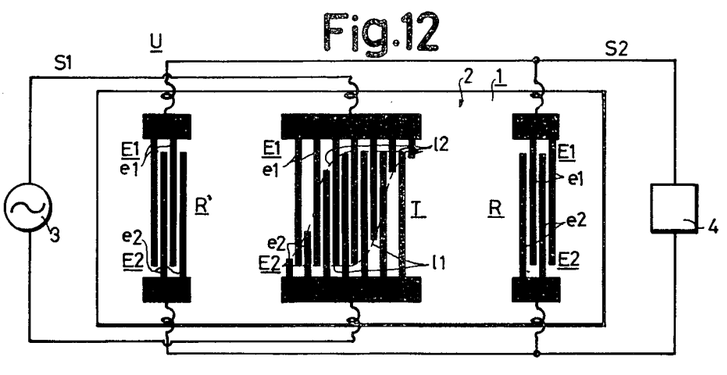

FIG. 12 illustrates another example of this invention, in which parts corresponding to those in FIG. 11 are marked with the same reference numerals and characters and no detailed description will be given of them. The present example is identical in construction with the FIG. 11 example except that the transmitting transducer T has the same construction as the transmitting transducer T employed in the example of FIG. 8.

With such a construction, in the case where the same dimensions as employed in the experiment of the FIG. 11 example, the relative minimum attenuation $A_p$ in the pass band having the center frequency $f_0$ at 34.2MHz was substantially 5dB and the relative minimum attenuation $A_r$ in the rejection band was approximately 45dB, and consequently the difference between them was about 40dB. By the way, in our experiment conducted with the FIG. 12 example in which the aforesaid lines $l1$ and $l2$ forming the aforementioned overlapping region were in the form of lines including curves based on the aforesaid function as indicated by broken lines in FIG. 3, the relative minimum attenuation in the pass band was about 6dB and the relative minimum attenuation in the rejection band was about 46dB, and consequently the difference between them was about 40dB.

Figure 13:
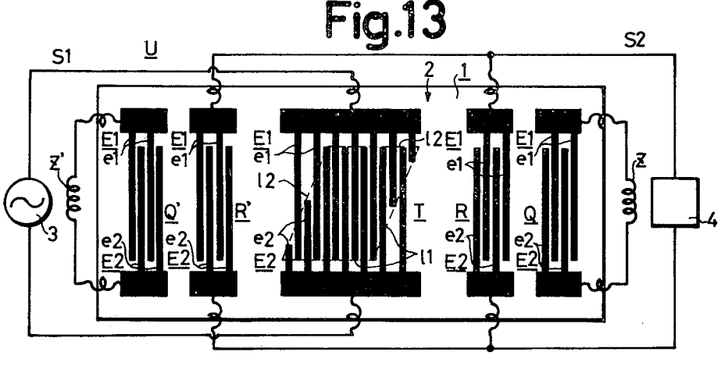
Figure 14:
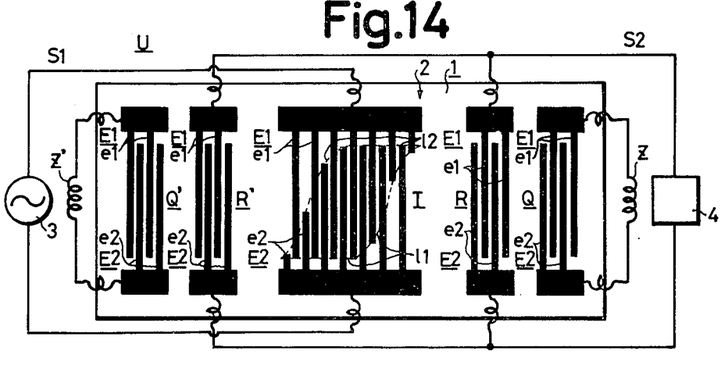

FIGS. 13 and 14 illustrate still further examples of this invention, in which parts corresponding to those in FIGS. 11 and 12, respectively, are marked with the same reference numerals and characters. These examples are identical in construction with the examples of FIGS. 11 and 12, respectively, except that reflecting transducers P' and P similar to the receiving transducers R and R', respectively, are disposed on the major surface 2 of the substrate 1 adjacent to the transducers R and R' on the opposite sides from the transmitting transducer T at positions symmetrical with respect thereto, respectively. Between the electrodes E1 and E2 of the reflecting transducers P' and P, there are respectively connected inductances Z' and Z for providing high impedance between the electrodes E1 and E2 at the aforesaid center frequency $f_0$.

In our experiment of the FIG. 13 example whose dimensions were the same as those in the case of FIG. 11, the minimum relative attenuation $A_p$ in the pass band with the center frequency $f_0$ at 34.2MHz was approximately 1.5dB and that $A_r$ in the rejection band was about 31.5db, with the result that the difference between them was about 30dB. By the way, in the case where the transducer T in the example of FIG. 13 was modified to have the same non-weighted electrode as used in the conventional filter shown in FIG. 1, the relative minimum attenuation in the pass band was about 1.5dB and that in the rejection band was about 21.5db, with the result that the difference between them was only about 20dB. In our experiment of the FIG. 14 example whose dimensions were the same as adopted in the example of FIG. 12, the relative minimum attenuation $A_p$ in the pass band with the center frequency $f_0$ at 34.2MHz was about 1.5dB and that $A_r$ in the rejection band was about 41.5dB, and consequently the difference between them was about 40dB. Further, in the case where the aforesaid lines $l1$ and $l2$ forming the overlapping region were in the form of lines including curves based on the aforementioned function, indicated by broken lines in FIG. 3, the relative minimum attenuation in the pass band was about 2.4dB and that in the rejection band was about 42.4dB, with the result that the difference between them was approximately 40dB.

The foregoing examples should be construed as being illustrative of this invention and should not be construed as limiting the invention specifically to them. It will be apparent that many modifications and variations may be effected without departing from the scope of the novel concepts of this invention.

We claim as our invention:

1. An elastic surface wave filter comprising at least a substrate for the propagation thereon of elastic surface waves, a transmitting and a first receiving transducer disposed on one major surface of said substrate in a predetermined spaced relation to each other, at least one of said transmitting and first receiving transducers comprising first and second comb-shaped electrodes, and said first and second comb-shaped electrodes being disposed with each electrode element of said second comb-shaped electrode extending between adjacent ones of electrode elements of said first comb-shaped electrode, in which the electrode elements of at least said first comb-shaped electrode are weighted in terms of length and a region formed by an envelope defined by tips of the electrode elements of said first and second comb-shaped electrodes has such a configuration that the extent of the region as measured along a line perpendicular to the lengthwise direction of the electrode elements, as a function of the distance lengthwise along the electrode elements, is substantially constant.

2. An elastic surface wave filter according to claim 1 wherein a second receiving transducer identical in construction with said first receiving transducer is disposed on the major surface of said substrate on the opposite side from said first receiving transducer and said second receiving transducer is electrically connected in parallel with said first receiving transducer.

3. An elastic surface wave filter according to claim 2 wherein first and second reflecting transducers, each having a non-weighted comb-shaped electrode formed on the major surface of said substrate, are disposed respectively on the opposite sides from said transmitting transducer with respect to said first and second receiving transducers.

* * * * *